United States Patent [19]

Woo et al.

[11] Patent Number: 5,077,230
[45] Date of Patent: Dec. 31, 1991

[54] METHOD FOR IMPROVING ERASE CHARACTERISTICS OF BURIED BIT LINE FLASH EPROM DEVICES BY USE OF A THIN NITRIDE LAYER FORMED DURING FIELD OXIDE GROWTH

[75] Inventors: Been-Jon Woo, Saratoga; Mark A. Holler, Palo Alto, both of Calif.

[73] Assignee: Intel Corporation, Santa Clara, Calif.

[21] Appl. No.: 563,098

[22] Filed: Aug. 3, 1990

[51] Int. Cl.$^5$ .................. H01L 21/265; H01L 21/76
[52] U.S. Cl. ........................................ 437/43; 437/69;
437/241; 437/941; 148/DIG. 114
[58] Field of Search ............... 437/43, 49, 52, 241,
437/941, 239, 69; 148/DIG. 112, DIG. 114

[56] References Cited

U.S. PATENT DOCUMENTS

| 4,113,515 | 9/1978 | Kooi et al. | 148/DIG. 112 |
| 4,401,691 | 8/1983 | Young | 437/239 |
| 4,780,424 | 10/1988 | Holler et al. | 437/43 |

OTHER PUBLICATIONS

Kooi et al., "Formation of . . . in NH$_3$ Gas", Journal of Electrochemical Society, vol. 123, No. 7, pp. 1117-1120, 1976.
"Identification and Elimination of Gate Oxide Defect Origin Produced During Selective Field Oxidation"; Itsumi, et al.; *J. Electrochem. Soc.;* vol. 129, No. 4: 4/82; pp. 800-806.
"Bird's Beak Configuration and Elimination of Gate Oxide Thinning Produced During Selective Oxidation"; Shankoff et al.; *J. Electrochem. Soc.;* vol. 127; No. 1; 1/80; pp. 216-222.

*Primary Examiner*—Brian E. Hearn
*Assistant Examiner*—C. Chaudhari
*Attorney, Agent, or Firm*—Blakely, Sokoloff, Taylor & Zafman

[57] ABSTRACT

A process for fabricating contactless electrically programmable and electrically erasable memory cells of the flash EPROM type. The cells use elongated source and drain regions disposed beneath field oxide regions. Ammonia formed during the field oxidation process reacts with the silicon substrate to form a thin silicon nitride layer in the beak region. A thin tunnel oxide is then grown. During tunnel oxide formation lateral growth of the field oxide is inhibited by the thin nitride layer previously formed. However, the tunnel oxide thinning (due to the existence of the thin nitride layer) induced low breakdown voltage is overcome by the enhanced oxide growth in the beak due to the buried source/drain dopants. The tunnel oxide in the erase region is therefore uniform and thin. The thin, uniform oxide in the tunnel region leads to improved erase characteristics.

13 Claims, 4 Drawing Sheets

METHOD FOR IMPROVING ERASE CHARACTERISTICS OF BURIED BIT LINE FLASH EPROM DEVICES BY USE OF A THIN NITRIDE LAYER FORMED DURING FIELD OXIDE GROWTH

BACKGROUND OF THE PRESENT INVENTION

1. Field of the Invention:

The invention relates to the field of semiconductor memory devices employing floating gates and the processes and methods for fabricating these devices.

2. Prior Art:

One class of non-volatile semiconductor memories employs floating gates, that is, gates which are completely surrounded by an insulative layer such as silicon dioxide. Typically, a polycrystalline silicon (polysilicon) layer is used to form floating gates. These gates are electrically charged, most often with electrons by transferring charge into and from the gates through a variety of mechanisms. The presence or absence of this charge represents stored, binary information. An early example of such a device is shown in U.S. Pat. No. 3,500,142.

The earliest commercial electrically programmable read-only memories (EPROMs) employing floating gates used p-channel devices which are programmed through avalanche injection. Charge is removed from these devices by exposing the array to electromagnetic radiation such as ultrviolet light (see U.S. Pat. No. 3,660,819). Later, EPROMs used n-channel devices and relied on channel injection as the mechanism for transferring charge into the floating gates (see U.S. Pat. No. 3,984,822). Many EPROMs fabricated with current technology still rely on channel injection for transferring charge into the floating gates and radiation for erasing the gates.

Another category of semiconductor floating gate memory devices are both electrically programmable and electrically erasable. Such a device is shown in U.S. Pat. No. 4,203,158. Tunneling through a thin oxide region transfers charge into and from the floating gates. In these memories, two devices are required for each memory cell. One device includes the floating gate and the other (typically an ordinary field-effect transistor) is used to isolate the floating gate device during various memory cycles.

A more recent category of floating gate memory devices uses channel injection for charging floating gates and tunneling for removing charge from the gates. Here, each memory cell comprises only a single device and the entire memory array is erased at one time, that is, individual cells or groups of cells are not separately erasable as in current EEPROMs. These memories are sometimes referred to as "flash" EPROMs or EEPROMs.

In some case, the floating gate memory devices are fabricated in arrays where each device or device pair is separated from other devices by field oxide regions. An example of this is shown in U.S. Pat. No. 4,114,255. In these arrays, a metal contact is needed for each device or device pair. These metal contacts take up substantial substrate area and therefore limit the reduction of device area. Another problem associated with fabricating cells of the type described in the above-mentioned patent is undesirable rounding of the edges of the common source. This rounding increases the floating gate to source tunneling area and therefore the floating gate to source capacitance. Increased tunnel area capacitance degrades the tunnel erase process. Additionally, there is always some misalignment of the polysilicon word line relative to the common source region. Since one dimension of the floating gate is defined in alignment with the word line, the total floating gate to source tunneling area will vary because of the word line misalignment. And, in fact, for each cell pair, due to the mirrored nature of the array, asymmetry will exist between the floating gate-to-source tunneling area for each pair. This causes a bi-modal distribution of the erase threshold. Obviously, it is undesirable to have a wide erase threshold distribution which can result from this distribution.

U.S. Pat. No. 4,780,424 provides a process for fabricating a buried bit line device which avoids the increased capacitance of the prior art cells. This process includes fabricating contactless electrically programmable and electrically erasable memory cells. Elongated source and drain regions are formed, and then field oxide is grown on top of the source and drain regions. The drain regions are shallow compared to the source regions. Furthermore, the source regions have more graded junctions. The floating gates are formed over a tunnel oxide between the source and drain regions with word lines being disposed perpendicular to the source and drain regions. One dimension of the floating gate is formed simultaneously with and in alignment with the word lines.

The programming and erasing function of the cells occur near the region where the tunnel oxide and field oxide meet, known as the reoxidation beak. The thickening of tunnel oxide in the source region can cause alternations to the erase characteristics of the cell. If the tunnel oxide is too thick, tunneling from the floating gate to source during erase is impeded and the erase times are thereby increased. If the tunnel oxide is too thin, breakdown-erasure of the gate without the application of a voltage to the source-may occur. Therefore, it is important that this region, that is, the reoxidation beak, be consistent to provide better erase characteristics.

In the prior art processes, a sacrificial oxidation layer is produced to avoid oxide thinning over the tunnel oxide because of a well known effect called the "Kooi" effect. This effect occurs when there are nitride ($Si_3N_4$) members present during a wet oxidation process, such as field oxide growth. Water ($H_2O$) from the wet oxidation process reacts with the nitride members to form ammonia ($NH_3$) or a similar compound along the nitride/field oxide interface. The ammonia then diffuses through the oxide to the silicon (Si) substrate. The ammonia then reacts with the silicon and forms a thin nitride layer on the silicon substrate in the tunneling region. This thin nitride layer inhibits the growth of the tunnel oxide as well as the lateral growth of the previously formed field oxide. For a discussion of the Kooi effect, see "Formation of Silicon Nitride at a Si-$SiO_2$ Interface during Local Oxidation of Silicon and during Heat-Treatment of Oxidized Silicon in $NH_3$ Gas" *J. Electrochem. Soc.*, Vol. 123, No. 7, p1117 (1976)

To avoid thinning of the tunnel oxide due to the presence of the thin nitride film, a sacrificial oxide is formed after removal of the nitride members and a previous pad oxide layer in prior art processes. The sacrificial oxide layer is then removed. When the sacrificial oxide is removed, the thin nitride layer is removed along with it. The tunnel oxide is then grown. A problem with the use of this sacrificial oxide layer to overcome the "Kooi" effect in the prior art process is the increased oxide thickness during tunnel oxide growth in the erase region (i.e. the reoxidation beak) due to the fact that lateral growth of the field oxide is no longer inhibited. The lateral oxide growth in the beak is accelerated by the presence of dopant from the source and drain regions which diffuses laterally into the beak region during the tunnel oxide growth. This increased oxide thickness leads to longer erase time.

What is needed is a process which forms a tunnel oxide of adequate thickness to prevent breakdown, but not excessively thick from the lateral growth of the field oxide, so that erase times are thereby reduced.

SUMMARY OF THE INVENTION

A process for fabricating a memory array of floating gate memory devices on a silicon substrate is described. Spaced-apart, parallel strips of silicon nitride are formed on the substrate over elongated first substrate regions. These elongated strips define elongated, parallel, spaced-apart second substrate regions between the strips. The second regions are subjected to doping steps such that alternate ones of these second regions are doped with an n-type dopant to a first level of doping and the others of the regions are doped with an n-type dopant to a second level of doping, the first and second levels of doping being different.

Then a field oxide is grown over these doped second regions, in effect, burying the second regions. During this oxide growth, ammonia or a similar compound is formed by reaction between $H_2O$ from the oxide growth process and the nitride strips. This ammonia then forms a thin nitride layer on the substrate surface in the regions where tunneling of charge during erase occurs. This thin nitride layer inhibits the formation of a thick reoxidation beak by inhibiting the lateral growth of the field oxide during tunnel oxide growth. During the tunnel oxide growth, the buried dopants from the source and drain also diffuse laterally into the beak region, enhancing the tunnel oxide growth in the localized beak region. Without the presence of buried dopants, the thin nitride film will lead to excessive tunnel oxide thinning in the beak region, resulting in poor tunnel oxide integrity such as low breakdown voltage. Thus, the presence of the thin nitride film together with the dopant enhanced oxidation lead to uniform, well defined reoxidation beaks, resulting in better erase characteristics.

After the silicon nitride strips are removed a plurality of first gate members are formed from a first layer of polysilicon over the first regions. The first gate members are the floating gates of the memory devices, and hence, are insulated from the second regions. Elongated second gate members are formed from a second layer of polysilicon. These second gate members are generally perpendicular to the first and second regions. The second gate members are the control gates for the memory devices.

DETAILED DESCRIPTION OF THE PRESENT INVENTION

A process for fabricating electrically programmable and electrically erasable floating gate memory devices is described. In the following description, numerous specific details are set forth such as specific doping levels, etc., in order to provide a thorough understanding of the present invention. It will be obvious, however, to one skilled in the art that these specific details need not be employed to practice the present invention. In other instances, well-known processing steps are not described in detail in order not to obscure unnecessarily the present invention.

The memory cells of the present invention are fabricated using standard metal-oxide-semiconductor (MOS) processing. The array which contains the cells, in the currently preferred embodiment is fabricated of n-channel devices. The peripheral circuits can employ either n-channel devices or complementary MOS (CMOS) devices.

Initially, the entire substrate is covered with a thin silicon dioxide ($SiO_2$) layer followed by a thicker silicon nitride ($Si_3N_4$) layer. The silicon nitride layer is patterned as needed for the peripheral circuits and, following a boron implant, field oxide regions are grown for the peripheral circuits. The array for this processing remains protected by the silicon nitride layer.

Figure 1:
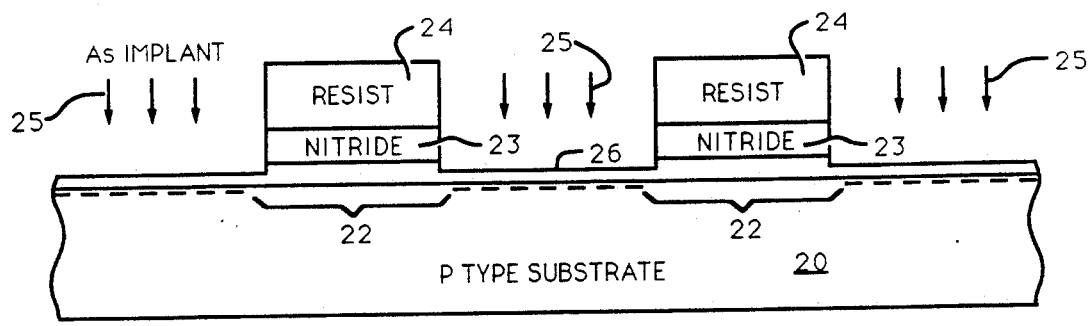
FIG. 1 is a cross sectional elevation view of a semiconductor substrate with nitride strips and first photoresist members formed thereon during arsenic implantation.

Referring now to FIG. 1, the array region of a p-type monocrystalline silicon substrate 20 is illustrated covered with a silicon dioxide layer 26. In this array region the silicon nitride has been etched to form elongated, parallel, spaced-apart strips 23 by using ordinary photoresist members 24 as a mask during the nitride etch. The regions 22 underlying the nitride strips 23 and photoresist members 24 are protected when the regions between the strips 23 are implanted with arsenic as indicated by the arrows 25. In the presently preferred embodiment, arsenic is implanted to a level of $1 \times 10^{15}/cm^2$ to $5 \times 10^{15}/cm^2$. This forms elongated, parallel, spaced-apart doped regions in the substrate.

After the arsenic is implanted, photoresist members 24 are removed.

Figure 2:
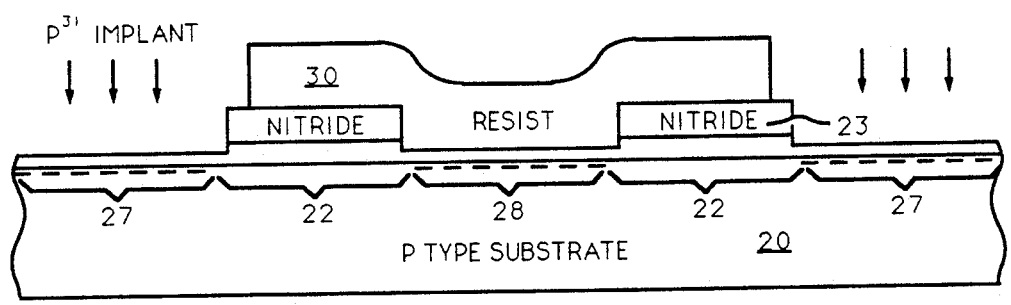
FIG. 2 is a cross sectional elevation view of the semiconductor body of FIG. 1 with the first photoresist members removed and second photoresist members formed on alternate regions between the nitride strips, during phosphorous implantation.

Next, as illustrated in FIG. 2, alternate ones of the elongated regions between the nitride members 23 (such as region 28) are covered with a photoresist members 30. The regions 28 are thus protected by photoresist members 30 while the regions 22 remain protected by the nitride strips 23. The elongated regions 27 are exposed and are implanted with an n-type dopant. The regions 27 in the currently preferred embodiment are doped with phosphorus to a level of approximately $0.2 \times 10^{15}/cm^2$ to $0.8 \times 10^{15}/cm^2$.

Another doping step (not illustrated) may be used to enhance programming for low voltage operation. After the photoresist members 30 are removed, additional masking members may be formed exposing regions 28 (drain regions).

Figure 3:
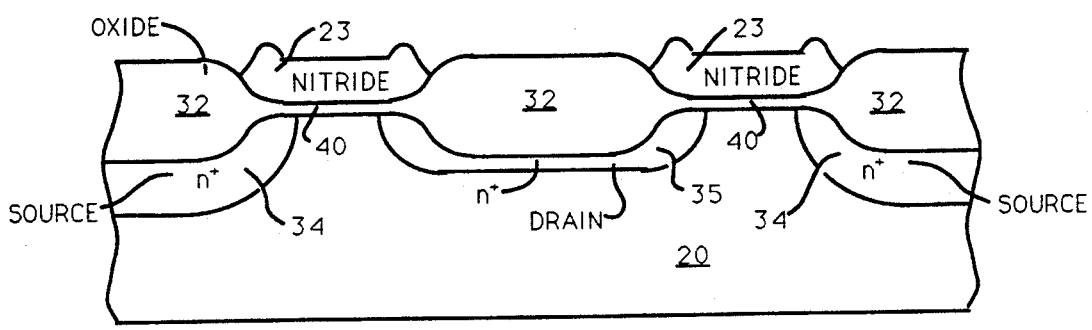
FIG. 3 is a cross sectional elevation view of the semiconductor body of FIG. 2 after a field oxide has been grown in the regions between the nitride strips.

Now the substrate is subjected to a high temperature (800° C.–900° C.) oxidation step. Relatively thick field oxide regions are grown over the elongated doped regions 27 and 28 forming the oxide regions 32 shown in FIG. 3. In the currently preferred embodiment, these oxide regions are approximately 2000 angstroms thick. Note the nitride members 23 prevent the formation of oxide in the channel regions 40. The high temperature oxidation step activates the arsenic and phosphorus dopants forming the source regions 34 (at the regions 27) and drain regions 35 (at regions 28). Note, as shown in FIG. 3, the source regions 34 are deeper than the drain regions 35. The phosphorus dopant diffuses more quickly into the silicon than arsenic, thus making these regions deeper. Moreover, the dopant gradient associated with the source regions are more gradual (graded) than that associated with the drain regions.

Figure 4:
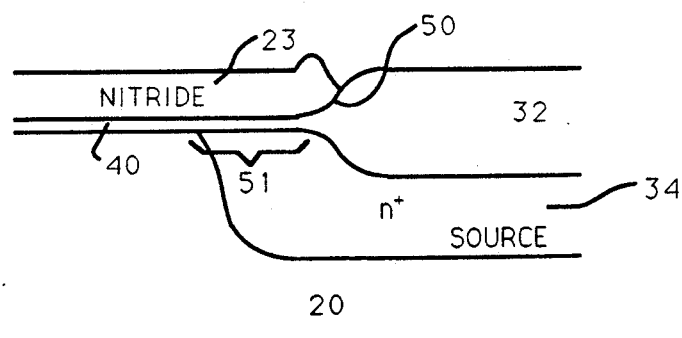
FIG. 4 illustrates the interface between the nitride strips and the field oxide regions of the semiconductor substrate of FIG. 3.

During the above-described high temperature oxidation step, the Kooi effect takes place. Ammonia or similar nitrogen compounds are formed by the reaction of nitride member 23 and $H_2O$ from the oxidation process. Referring to FIG. 4, this formation takes place along the interface of nitride member 23 and field oxide 32, in the region marked 50. The ammonia then diffuses through pad oxide 40 to the silicon substrate, generally in the region marked 51. The ammonia in contact with the surface of silicon substrate 20 over source region 34 forms a thin nitride layer, discussed below in conjunction with FIG. 6.

Figure 5:
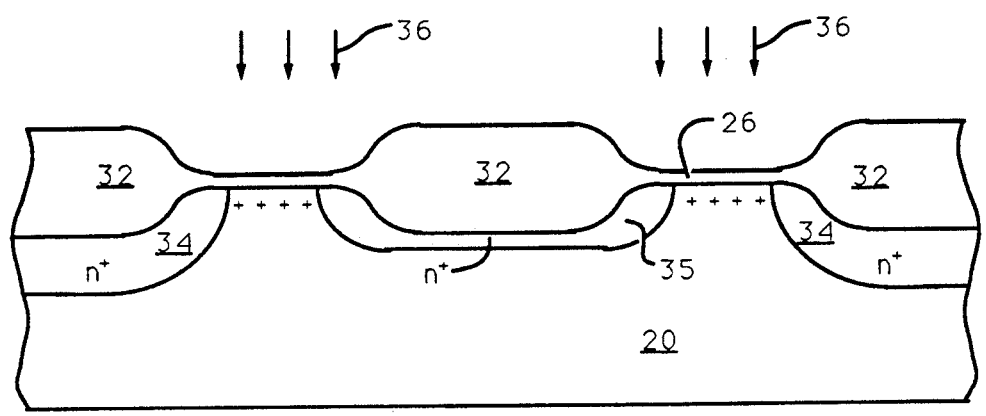
FIG. 5 is the semiconductor substrate of FIG. 3 with the nitride strips removed, during boron implantation.

After the silicon nitride members 23 are removed, the substrate is subjected to a threshold voltage adjusting implant. Referring to FIG. 5, boron, as indicated by lines 36, is implanted to a level of approximately $1 \times 10^{13}/cm^2$. The channel implant may consist of a combination of low energy and high energy boron implants.

Figure 6:
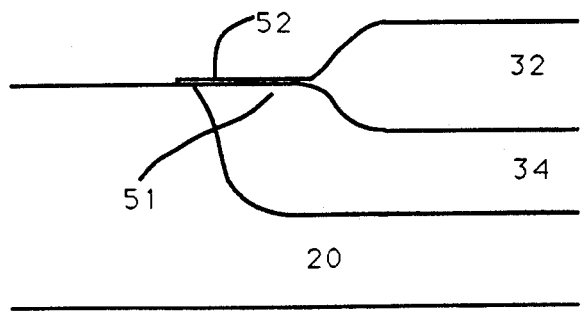
FIG. 6 is the semiconductor substrate of FIG. 5 illustrating the thin nitride layer formed on the semiconductor substrate surface.

FIG. 6 shows the substrate after removal of pad oxide layer 26. The oxide is removed using well known prior art techniques. Also shown is thin nitride layer 52 on the surface of silicon substrate 20 above the source region 34 formed by the reaction of ammonia and silicon as discussed above. The thin nitride layer 52 could be stoichiometric $Si_3N_4$ or it could be a mixed compound of silicon, nitrogen, oxygen, and possibly hydrogen. The thin nitride layer 52 inhibits the growth of tunnel oxide in the regions underlying thin nitride layer 52.

In prior art processes, in order to ensure a sufficient growth of tunnel oxide in the region covered by the thin nitride layer 52, the thin nitride layer 52 is removed prior to growth of the tunnel oxide. This is accomplished by growing a sacrificial oxide layer which is then removed in an oxide etch process. In the etch of the sacrificial oxide, thin nitride layer 52 as well as any ammonia remaining is removed.

Figure 7:
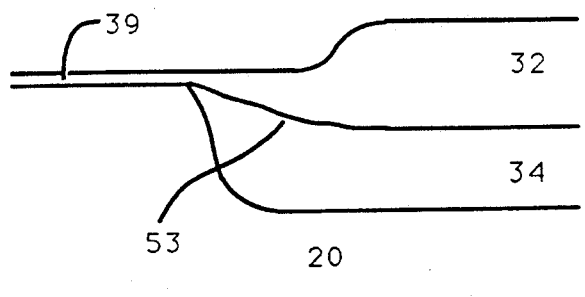
FIG. 7 is a prior art semiconductor device after tunnel oxide growth showing lateral growth of the field oxide, enhanced by the buried dopant.

FIG. 7 shows the prior art reoxidation beak 53 after growth of the tunnel oxide 39. The beak 53 is formed as a result of lateral growth of field oxide 32 during the tunnel oxide 39 growth process as well as enhanced oxidation due to the buried dopants. As can be seen from the figure, the width of tunnel oxide 39 is much greater due to the presence of beak 53. The voltage to be applied to source region 34 in order to erase the bit in a given gate will depend on the shape of beak 53 and more particularly the width of beak 53 in the tunneling region. Because the beak 53 is not uniform from cell to cell and very thick in prior art devices, there will be a wide distribution of erase voltages as well as very slow erase. This wide distribution and slow erase will in turn lead to an unacceptable product.

Figure 8:
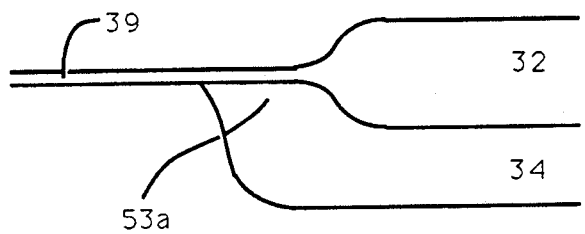
FIG. 8 is the semiconductor body of FIG. 6 after tunnel oxide growth showing inhibited lateral growth of the field oxide.

In the present invention, the pad oxide 26 and nitride members 23 are removed as in the prior art process. However, the thin nitride layer 52 of FIG. 6 is not removed by the sacrificial oxide growth and removal described above. Instead, with thin nitride layer 52 present, the tunnel oxide is grown. In the currently preferred embodiment, tunnel oxide 39 is grown in a conventional furnace at approximately 920° C. to a thickness of approximately 110 angstroms. During the tunnel oxide growth, the lateral field oxide growth into the tunnel region is inhibited by thin nitride layer 52. However, in the present invention, the oxide thinning of tunnel oxide 39 due to the thin nitride layer 52 of FIG. 6 does not lead to breakdown because the inhibition of oxide growth caused by thin nitride layer 52 in the tunneling region is compensated for by the faster rate of oxide growth in this region due to the lateral diffusion of dopant from source 34. The fact that oxide formation occurs at a faster rate in doped silicon than in undoped silicon is well known in the art. Because of the presence of thin nitride layer 52 as well as dopants which have diffused laterally during tunnel oxide 39 growth, a uniform tunnel oxide (no thickening and no thinning) is grown. The result is the reoxidation beak 53a shown in FIG. 8. The beak 53a of FIG. 8 of the present invention is narrower than the beak 53 of FIG. 7 formed in the prior art process. In addition, beak 53a is more uniform from cell to cell, resulting in a narrower erase voltage distribution as well as shorter erase times.

Figure 9:
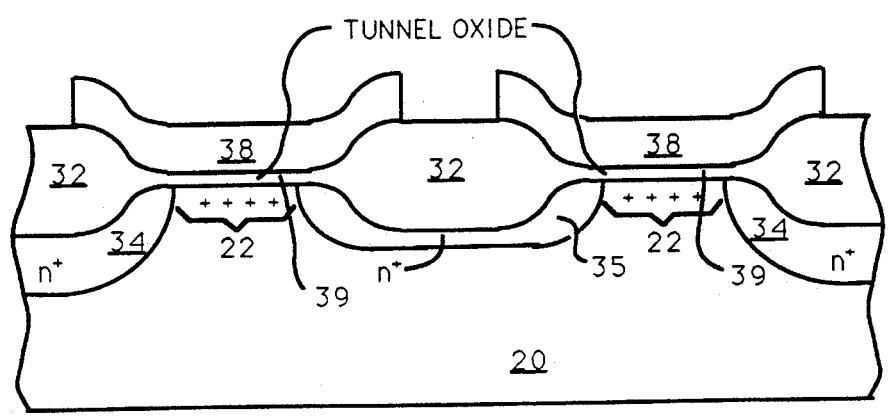
FIG. 9 is the semiconductor substrate of FIG. 8 with first gate members formed thereon.

After the gate oxide is formed, a layer of polysilicon is deposited over the substrate and the elongated, parallel, spaced-apart polysilicon strips 38 are formed over the channel regions 22 as shown in FIG. 9. These strips extend beyond the regions 22 and overlap the oxide regions 32.

Figure 10:
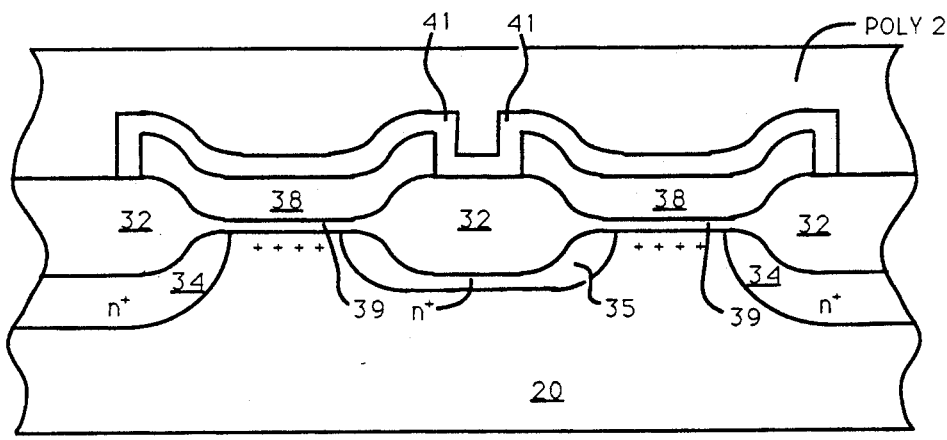
FIG. 10 is the semiconductor substrate of FIG. 9 with an oxide formed on the first gate members and second gate members formed thereon.
Figure 11:
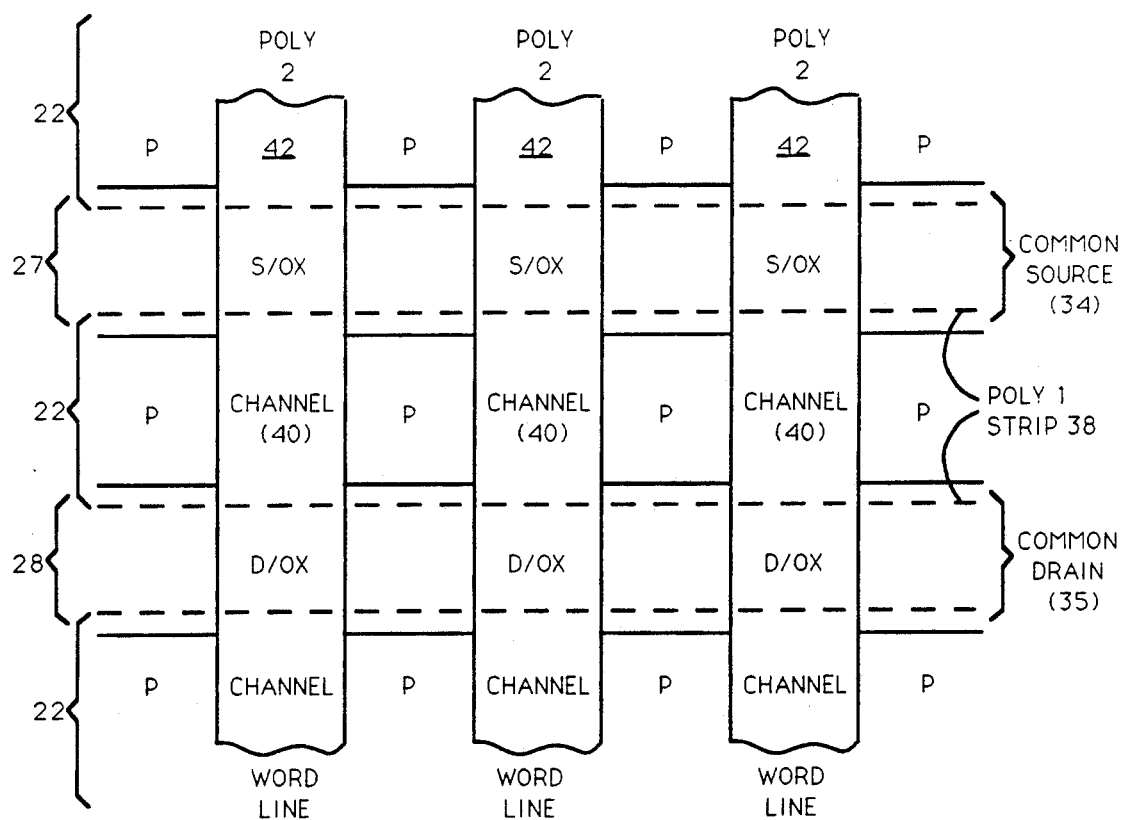
FIG. 11 is a plan view of a portion of an array fabricated in accordance with the present invention.

Now an oxide layer 41 is deposited over the polysilicon strips 38. In the currently preferred embodiment, oxide layer 41 is a multi-layer structure comprised of a first oxide layer, a silicon nitride layer and a second oxide layer (ONO). Following formation of oxide layer 41 a second layer of polysilicon is deposited on the substrate. This second polysilicon layer is etched to form elongated, parallel, spaced-apart polysilicon strips which are generally perpendicular to the source and drain regions. The strips 42 (which are the word lines in the memory array) are best seen in the plane view of FIG. 11. The elongated strips 38 formed from the first layer of polysilicon are now etched in alignment with the strips 42, thereby forming a plurality of floating gates. The resultant memory devices and the layout of the array is best seen in FIGS. 10 and 11. "S/OX" represents buried source regions and D/OX buried drain regions.

Metal layers and contacts are formed by well known methods to complete the memory.

The cells are programmed by applying a voltage to the drain regions 35 of 4-7 volts while the control gates (lines 42) are brought to a relatively high voltage (10-15 volts). To erase the floating gates, that is, to tunnel the charge from the floating gate to the source, a high voltage (10-15 volts) is applied to the source regions while the drain regions are floating and control gates are grounded. For a more complete discussion of the erasing of such devices see U.S. Pat. No. 4,797,856.

As can be seen in FIG. 11, the array of electrically erasable and programmable cells includes the parallel source and drain regions 34 and 35. With the above-described processing, the drain regions are sharply defined (abrupt, shallow junctions), thereby providing good programming efficiency. In contrast, the source regions are graded for improved junction breakdown. The source and drain region profiles are asymmetrical and optimized for their respective function. The reoxidation beak 53 formed by the present invention is well defined resulting in a uniform tunneling oxide 39 in the tunneling area. This in turn leads to improved erase characteristics.

Thus, a one transistor floating gate electrically erasable and electrically programmable read-only memory cell with a well defined reoxidation beak for improved erase characteristics has been described.

We claim:

1. A process for fabricating an array of floating gate memory devices on a substrate comprising the steps of:
    forming elongated, spaced-apart, parallel strips of silicon nitride over first regions of said substrate, said strips of silicon nitride defining elongated, parallel, spaced-apart second regions of said substrate between said strips;
    doping said second regions of said substrate between said strips such that alternate ones of said second regions are doped with an n-type dopant to a first level of doping and the others of said second regions are doped with an n-type dopant to a second level of doping, said first level of doping being different from said second level of doping;
    growing first oxide regions at said second regions in a wet oxidation process wherein H2O from said wet oxidation process reacts with said strips of silicon nitride to form a compound, said compound further reacting with said substrate to form a thin silicon nitride layer disposed on the surface of said substrate in tunneling regions, said thin silicon nitride layer inhibiting lateral growth of said first oxide regions during subsequent oxidation steps;
    removing said silicon nitride strips;
    growing second oxide regions at said first regions of said substrate, said second oxide regions being the first thermally grown silicon dioxide layer in said first regions following the removal of said silicon nitride strips;
    forming a plurality of first gate members from a first layer of polysilicon, said first gate members being disposed over said first regions and being insulated from said first regions by said second oxide regions;
    forming elongated second gate members from a second layer of polysilicon, said second gate members being formed over said first gate members and being insulated from said first gate members, said second gate members being generally perpendicular to said first and second regions.

2. The process as in claim 1 wherein said doping step comprises steps of:
    implanting an arsenic dopant into all of said second regions;
    implanting a phosphorous dopant into alternate ones of said second regions.

3. The process as in claim 1 wherein said second oxide regions are approximately 110 angstroms thick.

4. The process as in claim 2 wherein said second oxide regions are approximately 110 angstroms thick.

5. A process for fabricating an array of floating gate memory devices on a substrate comprising the steps of:
    forming elongated, spaced-apart, parallel strips of silicon nitride over first regions of said substrate, said strips of silicon nitride defining elongated, parallel, spaced-apart second regions of said substrate between said strips;
    doping said second regions of said substrate between said strips such that alternate ones of said second regions are doped with an n-type dopant to a first depth and the others of said second regions are doped with an n-type dopant to a second depth, said first depth being greater than said second depth;
    growing first oxide regions at said second regions of said substrate in a wet oxidation process wherein H2O from said wet oxidation process reacts with said strips of silicon nitride to form a compound, said compound further reacting with said substrate to form a thin silicon nitride layer disposed on the surface of said substrate in tunneling regions, said thin silicon nitride layer inhibiting lateral growth of said first oxide regions during subsequent oxidation steps;
    removing said silicon nitride strips:
    growing second oxide regions at said first regions of said substrate, said second oxide regions being the first thermally grown silicon dioxide layer in said first regions following the removal of said silicon nitride strips;
    forming a plurality of first gate members from a first layer of polysilicon, said first gate members being disposed over said first regions of said substrate and being insulated from said first regions of said substrate by said second oxide regions;
    forming elongated second gate members from a second layer of polysilicon, said second gate members being formed over said first gate members and being insulated from said first gate members, said second gate members being generally perpendicular to said first and said second regions of said substrate.

6. The process as in claim 5 wherein said doping step comprises the steps of:
    implanting an arsenic dopant into all of said second regions;
    implanting a phosphorous dopant into alternate ones of said second regions.

7. The process as in claim 5 wherein said second oxide regions are approximately 110 angstroms thick.

8. The process as in claim 6 wherein said second oxide regions are approximately 110 angstroms thick.

9. A process for fabricating an array of floating gate memory devices on a substrate comprising the steps of:

forming elongated, spaced-apart, parallel strips of silicon nitride over first regions of said substrate, said strips of silicon nitride defining elongated, parallel, spaced-apart second regions of said substrate between said strips;

doping said second regions of said substrate with an n-type dopant;

covering alternate ones of said second regions of said substrate;

doping the others of said n-type regions so that said others of n-type regions are more heavily doped with an n-type dopant;

growing first oxide regions at said second regions of said substrate in a wet oxidation process wherein $H_2O$ from said wet oxidation process reacts with said strips of silicon nitride to form a compound, said compound further reacting with said substrate to form a thin silicon nitride layer disposed on the surface of said substrate in tunneling regions, said thin silicon layer inhibiting lateral growth of said first oxide regions during subsequent oxidation steps;

removing said silicon nitride strips;

growing second oxide regions at said first regions of said substrate, said second oxide regions being the first thermally grown silicon dioxide layer in said first regions following the removal of said silicon nitride strips;

forming a plurality of first elongated polysilicon members from a first layer of polysilicon over said second oxide regions;

forming elongated second gate members from a second layer of polysilicon, said second gate members being formed over said first members, said second members being generally perpendicular to said first members;

etching said first elongated members in alignment with said second elongated members so as to form floating gate members disposed between said second elongated members and said substrate.

10. The process as in claim 9 wherein the first of said doping step comprises the implantation of arsenic and the second of said doping steps comprises the implantation of phosphorus.

11. The process as in claim 9 wherein said second oxide regions are approximately 110 angstroms thick.

12. The process as in claim 10 wherein said second oxide regions are approximately 110 angstroms thick.

13. The process as in any of the preceding claims in which said compound formed by the reaction of said $H_2O$ and said strips of silicon nitride comprises ammonia.

* * * * *